United States Patent [19]
Strite

[11] Patent Number: 5,952,680
[45] Date of Patent: Sep. 14, 1999

US005952680A

[54] MONOLITHIC ARRAY OF LIGHT EMITTING DIODES FOR THE GENERATION OF LIGHT AT MULTIPLE WAVELENGTHS AND ITS USE FOR MULTICOLOR DISPLAY APPLICATIONS

[75] Inventor: Samuel C. Strite, Kilchberg, Switzerland

[73] Assignee: International Business Machines Corporation, Armonk, N.Y.

[21] Appl. No.: 08/809,162

[22] PCT Filed: Oct. 11, 1994

[86] PCT No.: PCT/EP94/03346

§ 371 Date: Mar. 6, 1997

§ 102(e) Date: Mar. 6, 1997

[87] PCT Pub. No.: WO96/11498

PCT Pub. Date: Apr. 18, 1996

[51] Int. Cl.[6] .................................................. H01L 33/00
[52] U.S. Cl. ............................... 257/88; 257/89; 257/103
[58] Field of Search .................................. 257/87, 88, 89, 257/90, 101, 102, 103

[56] References Cited

U.S. PATENT DOCUMENTS 4,303,931 12/1981 Gaffre ........................................ 257/89
5,281,830 1/1994 Kotaki et al. ............................ 257/103

FOREIGN PATENT DOCUMENTS 0 351 867  7/1989  European Pat. Off. .

OTHER PUBLICATIONS

Kennedy, "Fabrication and properties of gallium phosphide variable colour displays", Microelectronics, vol. 5, No. 3, 1974.

"Fabrication and properties of gallium phosphide variable colour displays" by: David L. Kennedy; Microelectronics, vol. 5 No. 3, 1974, pp. 21–29.

"Three–color blue–green–red display made from single crystal" by: V.A. Dmitriev, Ya. V. Morozenko, I.V. Popov, A.V. Suvorov, A.L. Syrkin, and V.E. Chelnokov; Sov. Tech Phys. Lett. 12(5), May 1986: p. 221.

"A gray–scale addressing technique for thin–film–transitor/liquid crystal displays" by P.M. Alt et al., IBM Journal of Research and Development vol. 36, No. 1, pp. 11–22, 1992.

"Multi–Mode Matrix Flat Panel LED Varactor Concept Demonstrator Display" by K.T. Burnette, Proceedings of the Society for information Display, vol. 21/2, pp. 113–126, 1980.

"A High–Brightness GaP Green LED Flat–Panel Device for Character and TV Display" by Tatsuhiko Niina et al., IEEE Transactions on Electron Devices, vol. ED–26, No. 8, pp. 1182–1186, 1979.

"A multicolor GaP LED flat panel display device" by T. Niina et al., 1981 SID int. Symp. Digest Tech. Papers 12, pp. 140–141, 1981.

"GaN electroluminescent devices: preparation and studies" by G. Jacob et al., Journal of Luminescence vol. 17, pp. 263–282, 1978.

"Violet luminescence of Mg–doped GaN" by H.P. Maruska et al., Applied Physics Letters, vol. 22, No. 6, pp. 303–305, 1973.

"Blue–Green Numeric Display Using Electroluminescent GaN" by J.I. Pankove, RCA Review, vol. 34, pp. 336–343, 1973.

(List continued on next page.)

*Primary Examiner*—Minh Loan Tran
*Attorney, Agent, or Firm*—Anne Vachon Dougherty

[57] ABSTRACT

An array of light emitting diodes (LEDs) for the generation of light at multiple wavelengths. The LEDs are realized in a layered structure of semiconductor films grown on one substrate, said array comprising conducting portions for applying a bias to said LEDs and insulating portions, wherein at least one of the insulating or conducting portions is formed by a lateral variation of doping conditions of the top layer of the structure.

26 Claims, 8 Drawing Sheets

OTHER PUBLICATIONS

"Electric properties of GaN: Zn MIS–type light emitting diode" by M. R. H. Khan et al., Physica B 185, pp. 480–484, 1993.

EP–0–579 897 A1: "Light–emitting device of gallium nitride compound semiconductor"., Manabe et al; Jan. 26, 1994.

"Candela–class high–brightness InGaN/AlGaN double––heterostructure bluelight–emitting diodes" by S. Nakamura et al., Applied Physics Letters, vol. 64, No. 13, pp. 1687–1689, 1994.

"Blue–green diode lasers" by G. F. Neumark et al., Physics Today 6, pp. 26–32, 1994.

"Variable Hue GaP Diodes" by W. Rosenzweig et al., Solid–State Electronics, vol. 14, pp. 655–660, 1970.

"GaN, AIN, and InN: A review" by S. Strite et al., Journal of Vacuum Science and Technology, vol. B. 10, pp. 1237–1266, 1992.

"Photoluminescence of ion–implanted GaN" by J. I. Pankove, Journal of Applied Physics, vol. 47, No. 12, pp. 5387–5390, 1976.

MONOLITHIC ARRAY OF LIGHT EMITTING DIODES FOR THE GENERATION OF LIGHT AT MULTIPLE WAVELENGTHS AND ITS USE FOR MULTICOLOR DISPLAY APPLICATIONS

TECHNICAL FIELD

The present invention relates to monolithic arrays of light emitting diodes for the generation of light at multiple wavelengths, and multicolor displays based on such arrays.

BACKGROUND OF THE INVENTION

In our technical world displays have an important function as human interfaces for making abstract information available through visualization. In the past, many applications for displays were identified and realized, each with its own specific requirements. Therefore, different display technologies have been developed, each having their own strengths and weaknesses with respect to the requirements of particular display applications, thus making a particular display technology best suited for a particular class of applications.

The most important display applications being pursued are based on cathode ray tubes (CRT), liquid crystal displays (LCD), or vacuum fluorescent, plasma, light emitting diode (LED), electroluminescent, and electromechanic displays. Among the most decisive criteria dictating an appropriate display technology are cost of fabrication, power efficiency, reliability, weight, size of screen, depth, brightness, gray-scale capabilities, dynamic range, resolution (i.e. the minimum size of an addressable picture element on the display), contrast, dependence of the contrast on the viewing angle, switching speed of a particular pixel (pixel element), sunlight readability, color range, chrominance and chrominance contrast. CRTs have a dominant position on the display market due to their low price and their multicolor, high resolution and gray-scale capabilities. However, they have disadvantages if low weight, low power, small depth and sunlight readability is desired, for example in applications for battery driven portable computers.

The other mentioned display technologies come into play in areas where CRTs show weaknesses, especially if the weight, the depth and/or the power consumption of CRTs are simply not acceptable. For example, in applications for wrist watches or portable computers—an important domain of flat panel displays—or, generally, in applications which require large and/or flat displays, alternate technologies are preferred.

Due to their advantages—low weight, low power consumption, low depth—LCDs became the dominant flat panel display technology. The LC-material is cheap and the fabrication processes are scalable although at considerable cost, so that displays of arbitrary size can be made. However, many applications such as high resolution graphics or full motion video require high resolution, often in combination with high pixel switching speed. In these cases, LCD technology has drawbacks. In LCDs, high resolution is achieved with x-y matrix addressing techniques, thus reducing the number of address lines. However, x-y matrix addressing, in combination with the fundamental physical properties of LC materials, lead to high resolution only at the expense of a poor contrast between adjacent pixels, a small maximum viewing angle and other effects further deteriorating image quality, for example cross talk between pixels. These drawbacks can be partly overcome with so called 'active' x-y matrix addressing (see "A gray-scale addressing technique for thin-film-transistor/liquid crystal displays" by P. M. Alt et al., IBM Journal of Research and Development Vol. 36, No. 1, pp. 11–22, 1992). However, active matrix addressing requires a network of transistors of the same size as the display itself, each transistor controlling the charge stored in one capacitor, each capacitor influencing the orientation of the LC molecules between its electrodes and thus defining one pixel of the entire display. Today, the active matrix addressing makes possible brilliant full color displays capable of graphics with reasonable resolution or full motion video. However, large flat panel LCDs with active matrix addressing are expensive due to the costs of the fabrication of the transistor matrix array. In spite of the improvements due to the active matrix addressing, undesirable drawbacks remain such as the still limited viewing angle and the resolution being limited today to minimum pixel sizes of 100 $\mu$m×100 $\mu$m. Furthermore, the pixel size determines the maximum magnification factors of projection displays, i.e. displays which generate a secondary virtual or real image from a primary display element by means of optical imaging and thus allow for the generation of magnified images, provided the resolution of the original image prior to projection was sufficient.

Large high resolution LCDs with sizes more than 30 inches diagonal are difficult and expensive to fabricate. Therefore, large flat displays, as desired for high definition TV (HDTV) or public information boards, are the domain of vacuum fluorescent, electroluminescent or plasma displays despite their poorer power efficiencies. In particular, large full-color flat-panel plasma displays have excellent potential to replace cathode ray tubes in HDTV in the near future.

Light emitting diode (LED) displays are flat and lightweight, have sunlight viewability, and have—in comparison with LCDs—an excellent viewing angle and a high response speed of the order of 10–20 ns compared with 10–100 ms for LCDs. In addition, LED displays can have a smaller pixel size than LCD displays. LED displays have a pixel size dictated by the dimensions of a single LED, which can be quite small since it is defined by semiconductor lithography ($\cong$1 $\mu$m×1 $\mu$m or less). The smallest pixel size of LCD displays is (about 100 $\mu$m×100 $\mu$m) dictated by the physical properties (such as size of molecules, viscosity, etc.) of liquid crystals. The rapid modulation speed of LED displays makes it possible to use simple modulation techniques, e.g. on/off switching, for enhancing gray-scale capabilities. For example, for n gray-levels the LED switches on 0–n times inside of a single cycle.

LED displays entered the market place as a replacement for vacuum tube displays and were used as small indicators on instruments and small alphanumeric devices in hand-held computers. However, they lost market share to LCD technology in certain areas where the cost of their substrates and fabrication lead to unfavorable prices, or where the power consumption of LEDs was not competitive. On the other hand, these arguments in favor for LCD technology become less important for several reasons. First, progress in materials science and technology lead to advances in LED devices in terms of their power efficiency and further progress can be expected. Furthermore, the power advantage of LCDs is significant mainly in applications in which the LCD is used in a nonemissive mode, i.e. the LCD is illuminated by ambient light and acts only as reflective or transmissive spatial filter. In this case, power is only used for addressing and switching individual pixels. These are low power processes compared with driving emissive devices such as LEDs. However, there are many applications where LCDs cannot be used in a nonemissive mode, but must be illuminated with lamps, for example in high-brightness displays for laptop computers. In these cases, the power advantage of LCDs becomes questionable. The price argument in favor for LCDs becomes less important, when active matrix x-y addressing must be used. Then, the major part of costs must be attributed to the fabrication of the transistor matrix for addressing.

Therefore, areas of application for LED displays arise where advantageous features such as maximum viewing angle, fast response speed, and minimal pixel size are desired. However, the prospects of LED displays depend on the solutions of numerous problems, for example the color capabilities, the integration of different addressable LED-based light sources of different color on a monolithic chip, and the maximum size of such a monolithic chip.

Whereas 10 inches diagonal LCDs are common even with active matrix addressing and systems twice as large are in an experimental stage, the size of monolithic LED devices is typically between 2 and 25 mm and limited by the available size of the substrates on which the LEDs are fabricated, with the LEDs being normally realized in epitaxial semiconductor layers grown on said substrates. Larger LED based displays have been developed, but not in a monolithic version. They have been assembled using single diodes or monolithic modules having a small number of display points. A display with a resolution of 64 lines per inch, 4 inches by 4 inches in size, with 49,000 light emitting junctions composed of ¼ inch times ¼ inch GaP LED arrays, each array containing 16×16 light emitting junctions, is known from "Multi-Mode Matrix Flat Panel LED Varactor Concept Demonstrator Display" by K. T. Burnette, Proceedings of the Society for Information Display, Vol. 21/2, pp. 113–126, 1980. Other examples for hybrid LED displays are given in "A High-Brightness GaP Green LED Flat-Panel Device for Character and TV Display" by Tatsuhiko Niina et al., IEEE Transactions on Electron Devices, Vol. ED-26, No. 8, pp. 1182–1186, 1979.

Presently, full (in particular 3) color gray-scale capable matrix-addressable LCDs with 10 inches diagonal and a pixel size of 100 $\mu$m×100 $\mu$m are state of the art. Color capability is achieved by providing a flat display illuminated by white light through a 3-color filter array such that each pixel, the smallest picture element of the display, is subdivided into 3 adjacent independent subpixels, each subpixel representing one of three elementary colors—blue, green and red—which can be mixed with variable intensities such that any single pixel gives the impression of radiating any predefined color of the white light spectrum at any gray-level between zero intensity (defining "black" color) and a predefined maximum value.

So far, multicolor LED flat panel displays have been assembled from discrete LEDs (see for example "A multicolor GaP LED flat panel display device" by T. Nina et al., 1981 SID Int. Symp. Digest Tech. Papers 12, pp. 140–141, 1981). In order to simplify manufacturing of such a device by taking advantage of modern semiconductor integration and processing technology, monolithic multicolor LED based devices providing a multitude of LEDs would be desired, whereby either individual LEDs generate discrete colors tunable over a certain range, or at least two different groups of LEDs exist, each being characterized by a common wavelength of its LEDs, the common wavelengths of different groups being distinguishable. The meaning of the word 'distinguishable' in this context depends on the application, namely on the observer. If the observer is a person, the person should be able to distinguish different colors. If the display is interpreted by color-sensitive instruments, the instrument's color sensitivity is relevant.

The above-mentioned list of characteristic features of monolithic devices with integrated multicolor LEDs is not complete, if the display has to show arbitrary image data including chromatic contrasts. Then, monolithic devices providing a two-dimensional array of equivalent multicolor pixels, the pixels being distributed on a flat substrate, would be desired, whereby each pixel is either represented by at least one LED generating a color tunable within a certain range under electronic control and/or is represented by a group of spatially separated LEDs, each being capable of generating one of two or even more distinguishable wavelengths. For a natural representation of any arbitrary visible color, the generation of three wavelengths at the position of each pixel is desired, for example one wavelength belonging to the blue, another to the green and the third to the red part of the visible spectrum.

However, monolithic multicolor LED arrays providing a 1- or 2-dimensional distribution of individually addressable light sources on a substrate and providing 2 or more distinguishable colors are not known in the art. A special unsolved problem is the integration of LEDs capable of covering the entire spectrum of visible light.

In the following, the color capabilities of visible LEDs with special emphasis on the integration of different colors on the same substrate are briefly summarized, as it is known in the art. Semiconductor technologies are known to fabricate single monochrome LEDs for the entire spectrum of visible light. An overview about such technologies is given in textbooks such as "Flat-Panel Displays and CRTs", edited by L. E. Tannas, Van Nostrand Reinhold Company, Chapter 9, pp. 289–331, 1985. In the majority of applications, either direct electronic band-to-band transitions or impurity-induced indirect band-to-band transitions in the material forming the active region of the LED are used for light generation. In these cases, the energy gap of the material chosen for the active region of the LED, i.e. the zone where the electronic transitions responsible for the generation of light within the LED take place, determines the color of a particular LED. A further known concept for tailoring the energy of the dominant optical transition of a particular material and thus the wavelength of the generated light is the incorporation of impurities leading to the introduction of deep traps within the energy gap. In this case, the dominant optical transition may take place between a band-state of the host material and the energy level of the deep trap. Therefore, the proper choice of an impurity may lead to optical radiation with photon energies below the energy gap of the host semiconductor. In this case, the impurities, the host-semiconductor and the exact alloy composition chosen for the active layer offer three degrees of freedom for the design of a LED with a particular wavelength since the bandgap induced shift in the impurity levels in alloys would change the emission color.

Today, exploiting these two concepts for tailoring the emission wavelength of an LED and using III–V or II–VI compound semiconductors or their alloys for the active region of the LED, it is possible to cover the optical spectrum between near infrared and blue with discrete emission lines. However, due to constraints on the growth of high quality semiconductor layers, the general problem arises whether it is feasible to combine materials, doping conditions and device concepts for LEDs such that different wavelengths can be generated from a monolithic LED array.

In the majority of LED technologies, the active region is placed between appropriate semiconductor cladding layers, one being doped p-type and the other being doped n-type, and the optical transitions are induced by injecting electrons and holes into the active layer by applying an appropriate bias between the cladding layers. An important and sometimes restrictive premise of this approach is the existence of proper cladding materials which can be doped p- as well as n-type and can serve as substrates for the fabrication of high quality active regions. Examples of common materials for active regions in p-n-type LEDs and the spectral regions they are best suited for are summarized in the following, whereby spectral data are in general room temperature values. Materials mostly used are III–V semiconductors such as GaAs, GaAlAs, GaP, GaAsP, GaInP, AlGaInP GaN, AlGaN, InAlGaN, and II–VI compounds such as ZnSe/CdZnSe, CdZnSeS or MgCdZnSeS, and the IV—IV compound SiC.

Direct band-to-band transitions in GaAs are used for the generation of infrared light at around 870 nm. Exploiting direct band-to-band transitions in $Ga_xAl_{1-x}As$, the infrared/red spectral range between about 867 nm and about 652 nm can be covered by choosing an appropriate molar traction x. The material system $GaAs_{1-x}P_x$ is suitable for the spectral range 867 nm–610 nm (i.e. infrared—red) when exploiting direct transitions (x<0.49), and appropriate for 610 nm–548 nm (i.e. red—green) when taking advantage of indirect band-to-band transitions which can be enabled by impurity induced processes by doping with isoelectronic impurities such as nitrogen.

For blue light generating LEDs, wide bandgap semiconductors such as SiC, GaN, AlGaN, InAlGaN, ZnSe/CdZnSe or CdZnSeS are candidates. Until recently, the majority of such wide bandgap materials could not be grown p- as well as n-doped. Therefore, LEDs based on the conventional concept of exploiting p-n-junctions for carrier injection into the active region were not feasible. To circumvent this inconvenience, MIS-type diodes (i.e. metal-insulator-semiconductor diodes) have been successfully applied. In MIS-type LEDs, the active layer is made insulating and sandwiched between a conductive semiconductor layer and a metal contact. By applying an appropriate bias V between metal and conductive semiconductor layer, electrons are injected into the active layer, whereby the electron emitter is either the negatively biased metal layer or, if the semiconductor layer is n-doped, the negatively biased semiconductor layer. In the active layer, the injected electrons radiatively recombine with holes, which are refreshed by the counter electrode, the counter electrode being either the positively biased metal layer, if the electron emitter is an n-doped semiconductor layer, or an n- or p-doped semiconductor layer. Such structures show typical diode-like nonlinear current-voltage characteristics including a threshold voltage and an exponential increase of the injected current as a function of the applied bias V. The highest power efficiencies are usually achieved by emitting electrons from a n-type semiconductor layer towards the metal electrode, which serves as anode of the device. The overall performance of a MIS-LED, in particular the relationship between the injected current I and the applied bias V and the relationship between the intensity of the generated light and the injected current I, depend on many physical processes related to the carrier injection (e. g. tunneling, thermal excitation over barriers) and the carrier transport in the active layer (e.g. field ionization of deep impurities, impact ionization of deep impurities, hopping transport of holes, space charge current limitations, etc.). A more detailed discussion of these physical processes is not relevant for the understanding of this application, since an optimization of the performance of MIS-LEDs is not an object of this invention. In this context, it is sufficient to mention the relevance of the thickness of the insulating layer for the power efficiency of MIS-LEDs. For the thickness of the insulating layer, a trade-off exists. If it becomes too thin, an increasing part of the injected electrons passes through the insulating layer directly into the anode of the device without radiative recombination, thus lowering the power efficiency. If the insulating layer is too thick, the series resistance and the threshold voltage increase, again lowering the power efficiency. Typical values for an optimized thickness of the insulating layer, taken for a GaN-based MIS-LED, are in the range 20 nm–1 $\mu$m (see "GaN electroluminescent devices: preparation and studies" by G. Jacob et al., Journal of Luminescence Vol. 17, pp. 263–282, 1978).

Blue light emitting MIS diodes have been realized in the GaN system. Examples of these have been published in:
"Violet luminescence of Mg-doped GaN" by H. P. Maruska et al., Applied Physics Letters, Vol. 22, No. 6, pp. 303–305, 1973,
"Blue-Green Numeric Display Using Electroluminescent GaN" by J. I. Pankove, RCA Review, Vol. 34, pp. 336–343, 1973,
"Electric properties of GaN: Zn MIS-type light emitting diode" by M. R. H. Khan et al., Physica B 185, pp. 480–484, 1993,
"GaN electroluminescent devices: preparation and studies" by G. Jacob et al., Journal of Luminescence, Vol. 17, pp. 263–282, 1978,
EP-0-579 897 A1: "Light-emitting device of gallium nitride compound semiconductor".

In these studies, a common substrate for GaN is used, namely sapphire. On the sapphire substrate, a thick (several 100 $\mu$m) layer of n-type GaN was grown, often unintentionally doped GaN. On top of the n-GaN layer, the active layer of insulating GaN was grown. The insulating nature was realized by the incorporation of acceptors such as Zn, Cd or Mg during growth which compensate intrinsic donors and thus reduce the conductivity. Metals such as In, Ni, Ag, or Al served as metal contacts to the insulating active layer. As the sapphire substrate is insulating, special attempts are necessary to apply a bias to the MIS-diode. For making a contact to the n-GaN layer, either side contacts at the edges of the substrate are formed, or the n-GaN layer is made accessible from above by etching contact holes through the insulating GaN active layer.

It has also been recognized in the above-mentioned articles that the compensation of the insulating GaN layer by impurities such as Zn, Cd, or Mg can lead to different coexistent impurity levels within the energy gap of the host semiconductor whereby the density of the impurity states depends on the doping conditions, i.e. on the type of impurity, its concentration and/or the growth conditions. It is further known that the dominant electronic transitions which contribute to the electroluminescence of the compensated GaN layer take place between the lowest conduction band and an impurity state within the energy gap. Therefore, depending on the energy of the impurity states involved in the electroluminenscent processes, light is generated with photon energies of the bandgap reduced by the binding energy of the impurity state. Therefore, by appropriate tailoring of the distribution of impurity states, the peak of the GaN electroluminescence spectrum, which is in the ultra-violet if band-to-band transitions are dominant, is red-shifted due to the introduction of impurities. Based on this concept, GaN MIS-LEDs have been fabricated with peak wavelengths in the blue, green, yellow, orange and red part of the spectrum, together spanning the entire visible spectrum. The quantum efficiency as well as the threshold voltage of such devices are related to the color of their radiation. Quantum efficiencies of about 0.5% and 0.1% have been demonstrated for the green-yellow and for the blue part of the visible spectrum, respectively. Typical threshold voltages are 4V for the blue, 5V for the green, and 10V for the yellow.

Recently, due to progress in the development of techniques for p-doping of GaN and related compounds such as InGaN and AlGaN, the first p-n-type blue GaN based LEDs have been demonstrated. One example representing the state of the art is given in "Candela-class high-brightness InGaN/AlGaN double-heterostructure blue-light-emitting diodes" by S. Nakamura et al., Applied Physics Letters, Vol. 64, No. 13, pp. 1687–1689, 1994. The vertical layer structure of the LED disclosed in this article consists of a stack of GaN/AlGaN/InGaN layers grown on sapphire. The active layer consists of Zn doped InGaN sandwiched between p- and n-doped AlGaN layers, the sandwich forming a double-heterostructure. The Zn doping leads to optical transitions whose energy is related to the energy of Zn-related impurity states in a similar way as it is known for GaN (see above). Since the sapphire substrate of this device is not conductive, contact holes are etched through the active layer in order to get access to the n-GaN layer underneath.

Recent progress in developing doping techniques for II–VI semiconductors such as ZnSe, CdZnSe or CdSSe allows these materials to be exploited for the fabrication of p-n-junction based blue-light-emitting LEDs and even laser diodes. An impression about the state of the art of the growth of II–VI wide-bandgap materials can be taken from the article "Blue-green diode lasers" by G. F. Neumark et al., Physics Today 6, pp. 26–32, 1994.

In summary, using different semiconductor materials, their alloys and the incorporation of impurities, different materials for active layers of LEDs are available to fabricate single LEDs emitting light at wavelengths spanning the entire visible spectrum. However, concepts to integrate different LED-based light sources with multicolor capability on a single substrate are barely developed.

Variable hue GaN MIS-LEDs which change their color as a function of bias are known from the article "GaN electroluminescent devices: preparation and studies" by G. Jacob et al., Journal of Luminescence, Vol. 17, pp. 263–282, 1978. The wavelength tuning of such LEDs is based on the coexistence of different impurity levels in the energy gap of the host semiconductor and the bias dependence of their occupation with electrons. At low bias, the transitions with the lowest energy occur. However, with increasing bias, the emission due to this transition saturates, whereas a transition with a higher energy appears with increasing intensity and begins to dominate the electroluminescence spectrum at even further increased bias. The article cited above gives the example of a GaN MIS-LED which mixes yellow and blue light with an increasing share of blue light as a function of increasing bias, both colors being generated in the same active region.

A variable hue LED which resembles the preceding example was previously disclosed in the article "Variable Hue GaP Diodes" by W. Rosenzweig et al., Solid-State Electronics, Vol. 14, pp. 655–660, 1970. In this case, GaP is the host material and nitrogen and ZnO are used as dopants which generate different impurity states giving rise to electroluminescence at two wavelengths, red and green, the intensity of both colors being interrelated depending on the bias.

Another concept of integrating different LED-based light sources with different colors on a single substrate is the vertical integration of different active regions, each contributing to a particular one of a plurality of different emission lines. One example in accordance with this approach is given in the article "A Multi-Color GaP LED Flat Panel Display Device" by T. Niina, 1981 DID Int. Symp. Digest Technical Papers 12, pp. 140–141, 1981. The device disclosed consists of a stack of GaP layers, alternatively doped n-, p-, p-, and n-type, thus forming two p-n-junctions on top of each other which are electrically isolated from each other. The active region in one p-n-junction is doped such that impurity induced indirect band-to-band transitions result in the radiation of green light (see above). The other p-n-junction contains ZnO impurities enabling the generation of red light with photon energies below the energy gap of GaP due to transitions to impurity levels within the bandgap. In order to bias both p-n-junctions independently, three electrodes are necessary whereby complicated processing steps are required for their fabrication, namely the etching of isolation trenches for the electrical isolation of the electrodes and the local overcompensation of the top n-GaP layer with acceptors for enabling electrical contact to the p-GaP layers. The possibility of independently biasing each p-n-junction allows for the generation of any intermediate color between red and green, whereby for an observer, the light seems to come from a single light source. According to the above-mentioned reference, single elements of such 2-color LEDs have been made and used as picture elements of large flat panel displays for TV applications.

Up to now, these concepts have not been extended to provide a multitude of multicolor LED-based light sources on a single substrate. In particular, the question of how to provide a multitude of LED-based light sources with predefined colors between blue and red, with predefined shape, and predefined position on a single substrate has not been tackled.

SUMMARY OF THE INVENTION

It is an object of this invention to provide a monolithic array of light emitting diodes for the generation of light at multiple wavelengths.

It is a further object of this invention to provide a monolithic array of light emitting diodes for the generation of light at multiple wavelengths, together spanning the entire visible spectrum.

It is a further object of this invention to propose a monolithic array of light emitting diodes for the generation of light at multiple wavelengths which are simple and cheap to manufacture, and to propose appropriate materials for the LEDs and the substrates.

It is a further object of this invention to provide applications of monolithic multicolor LED arrays for displays with special emphasis on high resolution full color displays with gray-scale and video capability, whereby the term full color denotes the capability of representing any color of the visible spectrum. The LEDs may represent light sources of any shape or size, thus defining arbitrary picture elements of a display.

The invention as claimed is intended to meet these requirements. It provides an array of light emitting diodes (LEDs) for the generation of light at multiple wavelengths, the LEDs being realized in a layered structure of semiconductor films grown on one substrate, said array comprising contact areas for applying a bias to said LEDs, at least two particular LEDs of said LEDs having different electroluminescence spectra obtained in that only the first of said particular LEDs has an electroluminescence spectrum being determined by impurity states in the material forming its active region, said impurity states leading to optical transitions with energies below the bandgap energy of said active region, or both of said particular LEDs have at least one impurity state in the material forming the respective active region, said impurity states being different for both of said LEDs due to different local doping conditions, and each of said impurity states leads to optical transitions with energies below the bandgap energy of said active region, said optical transitions contributing to said electroluminescence spectra of said particular LEDs, or said electroluminescence spectra of both of said particular LEDs comprise at least two emission lines with different emission wavelengths, both of said emission lines being attributed to optical transitions which are related to impurity states in the material forming the active region of said LEDs and have a photon energy below the bandgap energy of said active region; said two emission lines having the same photon energy but different relative intensities for said particular LEDs.

The basic idea behind this invention is the choice of a semiconductor material which can be modified by doping such that its electroluminescence spectrum contains one or more emission lines which are due to electronic transitions from excited electronic states of the semiconductor material to one or more doping-induced impurity states within the energy gap, whereby it is assumed that the wavelength of the impurity-induced emission lines are influenced by the doping conditions, for example the kind of dopants, the mixture of different dopants, the doping concentration, or the method of the doping procedure. The bandgap of the active-layer material determines the shortest wavelength to be generated by electroluminescence. Therefore, a wide-bandgap semiconductor with a bandgap of ≈3 eV is used for the active region of the LEDs if the emission wavelengths span the entire visible spectrum between infrared and ultraviolet. Using such a material for the active region of LEDs, there are different approaches possible to design multicolor LED arrays in accordance with this invention.

One approach is based on an active layer with a lateral variation of the doping conditions. Therefore, LEDs fabricated at different positions on the substrate have different emission wavelengths. For the fabrication of displays with an arbitrary distribution of picture elements of arbitrary shape and arbitrary color, doping methods are exploited which allow for the local incorporation of dopants after the growth of the active layer on a substrate in combination with mask steps for the control of the lateral doping profile. If the LEDs have only one emission wavelength, the emission wavelength of a particular LED remains stable upon changing the bias applied to it (provided that secondary effects such as temperature effects are neglected). Different gray-scales are realized by changing the bias, and/or rapidly modulating the LEDs with variable speed and/or amplitude.

The second approach is based on an active layer which is doped such that two or more emission lines appear in electroluminescence. In this case, as stated in the introductory portion of this application, such an active layer leads to variable hue LEDs which change color with bias, whereby the color is actually a mixture of different elementary colors. Thus, a lateral variation of bias with position on the substrate leads to a lateral variation of the color generated in the active layer. This statement holds, even if the doping conditions are homogeneous in the entire active layer. According to this approach, a monolithic multicolor LED array in accordance with this invention is realized by growing an appropriate layered structure of semiconductors on an appropriate substrate whereby the layer serving as the active layer of the LEDs is doped in agreement with the above-mentioned criteria, and by subsequently fabricating a multitude of LEDs on said layered structure, whereby the LEDs can be independently biased.

On the basis of the multicolor LED arrays in accordance with this invention, novel multicolor displays can be made by adding features such as means for addressing individual LEDs and applying an appropriate bias to them, interfaces for handling data to be displayed, timing systems for handling time-dependent image data and/or gray-scale processors for handling gray levels.

DESCRIPTION OF THE DRAWINGS

The invention is described in detail below with reference to the following schematic drawings.

GENERAL DESCRIPTION

In order to illustrate the inventive idea of this application, embodiments of multicolor LED arrays based on the material system $(Al_xGa_{1-x})_yIn_{1-y}N$ ($0 \leq x, y \leq 1$) are shown. The reason for this particular choice of a material system is twofold. First, for some members of this family of materials, doping induced multicolor electroluminescence has been demonstrated, as mentioned in the introductory portion. Second, this family of materials includes wide-bandgap semiconductors and is, therefore, a candidate of materials for full color displays covering the entire optical spectrum between near-infrared and near-ultraviolet.

On the other hand, doping-induced multicolor electroluminescence is not limited to $(Al_xGa_{1-x})_yIn_{1-y}N$ and can be considered as a general concept for semiconductors. For example, GaP doped with N leads to green electroluminescence and GaP doped with ZnO leads to red electroluminescence (see introductory part). Thus, the particular choice of the material system $(Al_xGa_{1-x})_yIn_{1-y}N$ does not mean any loss of generality concerning multicolor capability of semiconductor materials. However, it has the advantage of offering multicolor capabilities with an extreme spectral width compared with materials having a narrower energy gap. Other wide-bandgap semiconductor such as II–VI compounds serve for the same purpose.

The implementation of the inventive idea of this application leads to two different geometrical arrangements, the first being characterized by a vertical injection of carriers into the active region, whereas the second is based on a lateral injection (with respect to the substrate). First, the vertical arrangement is discussed.

Figure 1A:
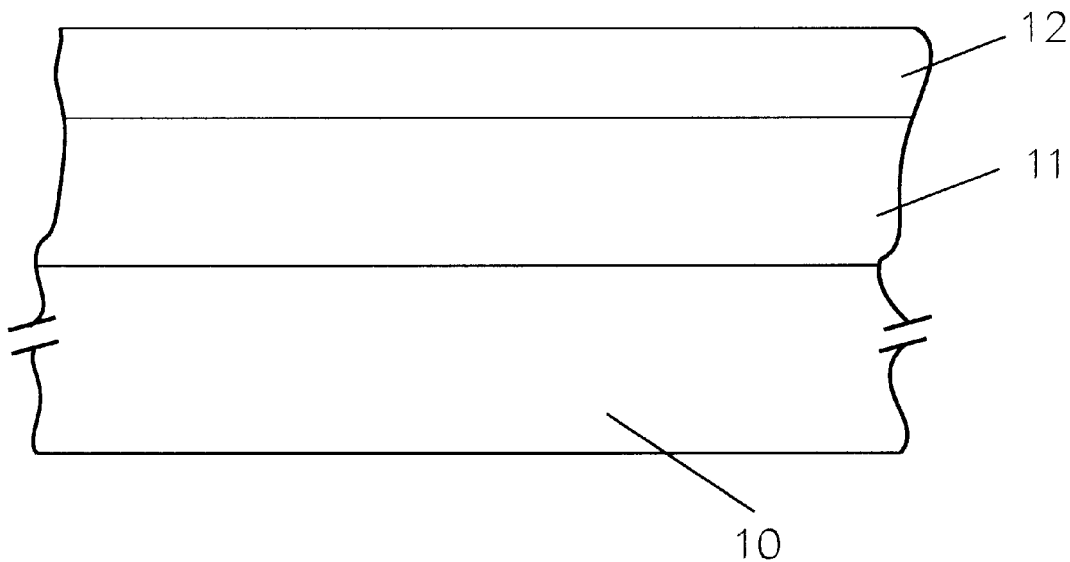
FIG. 1A shows an example of a layered structure of semiconductors on top of a planar substrate for the fabrication of multicolor MIS-type LED arrays.
Figure 1B:
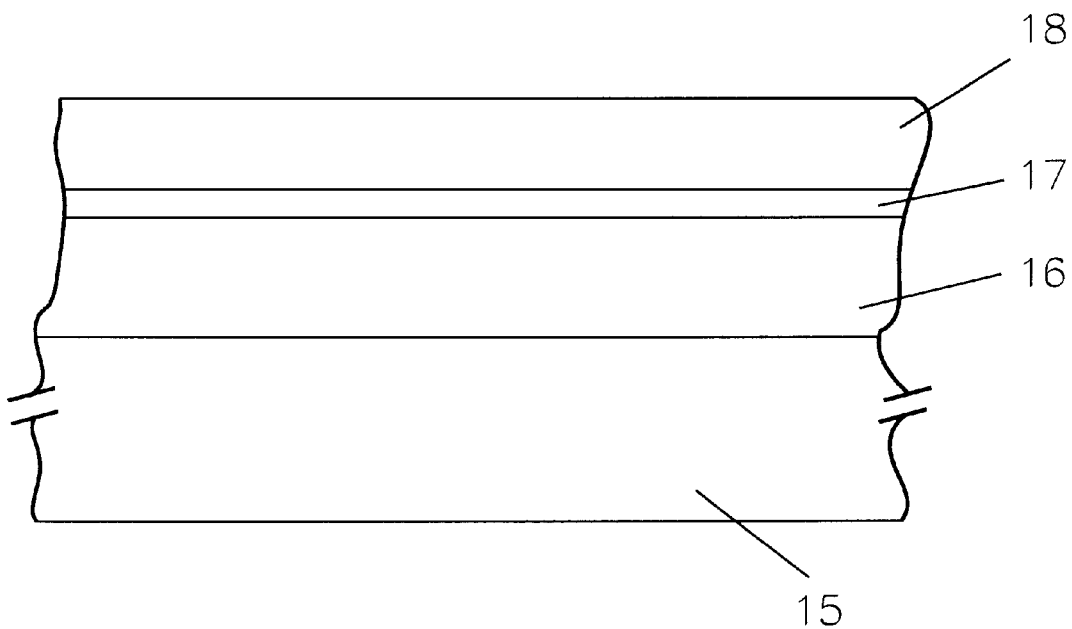
FIG. 1B shows an example of a layered structure of semiconductors on top of a planar substrate for the fabrication of multicolor p-n-type LED arrays.

FIGS. 1A and 1B show layered semiconductor structures based on $(Al_xGa_{1-x})_yIn_{1-y}N$. These layered structures are considered as starting points for the fabrication of preferred embodiments of this invention. They are kept as simple as possible, i.e. only one layer serves as active layer for the entire multicolor LED array. The layered structures shown in FIG. 1 are used in the following for a demonstration of the inventive idea of this application for two major LED technologies, namely MIS- and p-n-type devices.

Initially, we discuss only devices based on crystalline materials. However, the basic concepts being summarized in the following can be extended to other states of solid matter, e.g. to polycrystalline or amorphous material.

FIG. 1A shows an example of a layered structure of semiconductors on top of a planar substrate for the fabrication of multicolor MIS-type LED arrays. Several substrates are suitable for devices based on crystalline $(Al_xGa_{1-x})_yIn_{1-y}N$, for example sapphire, SiC, ZnO or AlGaInN. Sapphire, which is insulating, is the substrate material traditionally used. The application of SiC, ZnO and AlGaInN as suitable substrates is also known but not widespread. Below, it is shown that it is the good conductivity of SiC and AlGaInN of which advantage can be taken, because due to this property, means for applying a bias to a particular LED in a LED array can be simplified, such simplification being one of the objects of this invention. Both substrates, sapphire and SiC, are transparent for visible light. With such substrates, the LEDs to be discussed in the following can be designed such that the light generated by a particular LED is preferably emitted through the substrate into the halfspace below the substrate (whereby the term 'below' corresponds to the backside of substrate, i.e. the side not being used for the deposition of the layers of semiconductors). In this case, an antireflection coating optimized for the emission wavelengths is deposited on the backside of the substrate in order to optimize the external power efficiency of the LEDs and to avoid multiple reflections of the light coming from a particular LED. Multiple reflections are not desired since they lead to a multiple appearance of a single light source and thus to optical crosstalk of adjacent LEDs, i.e. light which, for an observer, seems to come from a particular LED might appear due to reflections of another LED in the neighborhood. Such crosstalk is unfavorable in particular in high-resolution display applications which require small pixel sizes and thus a high density of LEDs. Of course, LED arrays based on the structures in FIG. 1 can be designed such that the electroluminescent light directed towards the halfspace above the substrate is used. In this case, too, multiple reflections at the backside of the substrate and the topside of the structure must be suppressed for the avoidance of optical crosstalk.

High-quality crystalline layers of $(Al_xGa_{1-x})_yIn_{1-y}N$ can be grown by means of epitaxy methods such as metal organic vapor phase epitaxy (MOVPE) or molecular beam epitaxy (MBE). Typical growth conditions are described in the literature, e.g.

EP-0-579 897 A1
EP-0-551 721 A2
"GaN, AlN, and InN: A review" by S. Strite et al., Journal of Vacuum Science and Technology, Vol. B 10, pp. 1237–1266, 1992.

From these References, also descriptions of standard device processing steps such as etching processes, doping $(Al_xGa_{1-x})_yIn_{1-y}N$ p- and n-type during and after crystal growth with a variety of dopants (e. g. Zn, Cd, Si, and Mg), and the formation of metal coatings resulting in either Schottky barriers or ohmic contacts can be taken. Such fabrication steps are considered as known and are not discussed in detail when they are mentioned in the following in the context of the embodiments of this invention.

The layered structure shown in FIG. 1A comprises a conductive n-$(Al_xGa_{1-x})_yIn_{1-y}N$ layer 11 on top of the substrate 10, and a further $(Al_xGa_{1-x})_yIn_{1-y}N$ layer 12 serving as active layer of the LEDs to be realized in this structure. The first-grown n-$(Al_xGa_{1-x})_yIn_{1-y}N$ layer 11 is either undoped and its n-type conductivity relies on nitrogen vacancies (i.e. unintendedly n-doped), or its conductivity is further increased by n-doping, e.g. by adding donors such as Si or nitrogen vacancies during its growth. For fabrication of a MIS-type LED based on the layered structure in FIG. 1A, the top layer 12 must be made insulating by compensating intrinsic donors. In accordance with this invention, different doping procedures are suitable, depending on the particular application. This doping can be performed either during or after growth of the active layer. For the compensation, the same impurities which lead to the multicolor capability of the active layer can be used.

If the multicolor capability of the inventive devices is achieved by exciting at least two different impurity-induced optical transitions together and thus mixing different elementary colors, the compensation of the active layer can be performed during the growth of the active layer, or after its growth by exploiting methods such as diffusion of ion implantation, thus resulting in a nearly homogeneous distribution of dopants in the active layer 12. In this case, either at least two different impurities such as Zn in combination with Cd or high concentrations of one dopant such as Zn, leading to at least two different impurity states (see introductory part) can be used.

However, if the multicolor capability of the inventive LED arrays relies on lateral variation of the doping conditions in the active layer, it is favorable to perform the doping after the growth of the active layer. This is favorable if the doping conditions must be varied spatially over a large range as it is required if the novel LED array is designed for covering a large range of the visible spectrum. The large lateral variation of the doping conditions required in this case cannot be easily controlled during growth of the active layer in the present state of the art. An approach to realize a large lateral variation of the doping conditions, in accordance with this invention, after growth of the active layer will be discussed later in context with FIG. 2.

In FIG. 1A, the first semiconductor layer 11 grown on the substrate 10 is characterized as being n-type. However, as has been mentioned in the introductory portion, the MIS-LEDs to be discussed in the following function also with the first semiconductor layer being p-doped, provided the sign of the operating bias is reversed. The main difference between both structures is the larger resistance of a p-layer, resulting in a slightly reduced power efficiency of the p-layer based MIS-LED.

For the thickness of the insulating layer 12 in FIG. 1A, trade-offs exist leading to optimized values. According to remarks in the introductory portion, a thickness of the active layer in the range of 20 nm–1 $\mu$m is reasonable.

FIG. 1B depicts a second layered structure which is the main building block for a second embodiment of this invention, namely a multicolor array of p-n-type LEDs. The layer sequence 15–18 chosen is in some respects similar to a known structure cited in "Candela-class high-brightness InGaN/AlGaN double-heterostructure blue-light-emitting diodes" by S. Nakamura et al., Applied Physics Letters, Vol. 64, No. 13, pp. 1687–1689, 1994. This reference has already been acknowledged in detail in the introductory portion. We adopt in the following the idea of using a double-hetero structure consisting of an active layer 17 $(Al_xGa_{1-x})_yIn_{1-y}N$ sandwiched by two $(Al_uGa_{1-u})_vIn_{1-v}N$ cladding layers 16 and 18, one being p-doped, the other being n-doped. The mole fractions x, y, u, and v are chosen such that a heterobarrier occurs at the interfaces between active and cladding layers (e.g. with x=0, y=0.5, v=1, u=0.5). For n- and p-doping of the cladding layers, Si and Mg, respectively, can be used as dopants. In the above-mentioned article, a single blue-light emitting LED is disclosed which benefits in terms of brightness and wavelength redshift from impurity related transitions in the active layer, whereby the impurity Zn has been introduced during growth, leading to a homogeneous doping of the active layer. However, in the framework of this invention, the doping has a different role, namely it has to introduce multicolor capability. Again, both doping approaches having been discussed in the context of FIG. 1A can been applied, either a doping leading to at least two different impurity states, this kind of doping being performed either during or after growth of the active layer 17, or a doping with a large lateral variation of the doping conditions, this doping procedure being performed after growth of the active layer 17.

In the next step, it is shown how structures like those depicted in FIG. 1 can be doped with a large lateral variation of the doping conditions. This doping is not only used in the following for adding multicolor capabilities but also for a modification of the conductivity of semiconductor layers in the lateral direction. This latter application is relevant for the electrical isolation of adjacent devices in arrays. The task of doping of semiconductor layers after their growth including the control of a lateral variation of the doping conditions is divided into a mask step with a subsequent doping step, whereby several steps of this kind may be sequentially carried through. During a mask step, the surface of the semiconductor structure to be modified by doping is covered by a mask such that only certain islands on top of the surface are accessible for dopants. During the subsequent doping step, the masked semiconductor structure is exposed to dopants. For doping, all methods are adequate which allow for the controlled incorporation of dopants into a defined volume of a semiconductor structure through the surface of this structure. Examples of such doping methods are ion implantation or vapor deposition. An additional annealing leads to a redistribution of dopants by diffusion within the sample and/or to annealing of defects. The annealing is optional for ion-implantation since in this case, its function is mainly to activate dopants rather than to redistribute them. However, after vapor deposition, annealing is mandatory for the incorporation of dopants into a semiconductor structure. The so-called 'doping conditions' can be described by a set of parameters which characterize the doping process as completely as possible. The most important ones are the kind of incorporated dopants and their local concentration described by a 3-dimensional doping profile. In general, if n different doping conditions must be realized at different locations of a semiconductor layer, n different mask steps with a subsequent doping step must be carried through.

For GaN-based LEDs, a $SiO_2$ mask can be used, the mask being fabricated by growing a $SiO_2$ layer on top of the semiconductor structure, and subsequent etching of predefined holes through the $SiO_2$ overlayer, thus defining areas accessible to the dopants. Through these holes, the active layer can be doped. This kind of mask fabrication is conventional for GaN-based devices. Processing steps related to it can be taken from the above-mentioned Reference EP-0-579 897-A1.

Examples for doping conditions which can be achieved with the above-mentioned doping procedures and allow for a compensation of n-type GaN and lead to electroluminescence of GaN in different sections of the entire visible spectrum are known from the article.

"Photoluminescence of ion-implanted GaN" by J. I. Pankove, Journal of Applied Physics, Vol. 47, No. 12, pp. 5387–5390, 1976, and the other References mentioned above in the context of GaN-based MIS-LEDs. Equivalent data for other members of the family $(Al_xGa_{1-x})_yIn_{1-y}N$ can be considered as being a continuous function of x and y.

In the following, the fabrication of LEDs on the basis of the structures depicted in FIGS. 1A and 1B are discussed. No special attention is paid for arrays of variable hue LEDs. Their structures are basically the same as those of LED arrays with a lateral variation of the doping conditions. In addition, both types of LED arrays can be fabricated by exploiting the same processing steps after growth of the active layer. Only the choice of the doping conditions of the active layer is different for both types of LED arrays. Therefore, also a single monolithic LED array comprising both types of LEDs can be made by forming a proper pattern of dopants in a single layered semiconductor structure. For the sake of convenience, only LED arrays with a lateral variation of the doping conditions are treated in the following.

In the next step, it is shown in detail how the above-mentioned mask steps and doping procedures are used for the fabrication of multicolor LEDs. In order to give a few examples, the structures shown in FIG. 1 are used as starting points.

Figure 2:
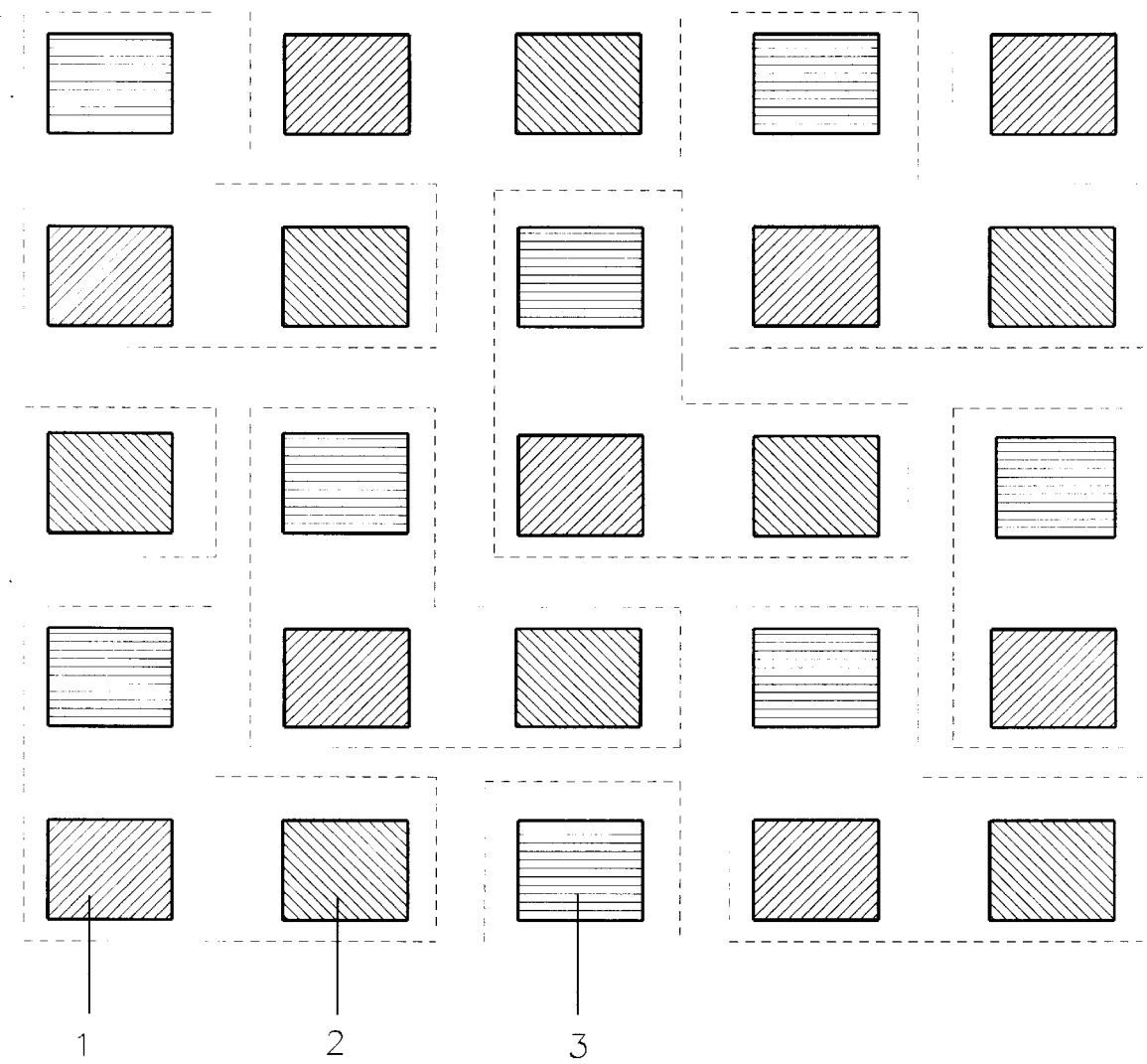
FIG. 2 depicts an example for a multitude of pixels corresponding to masks for the definition of lateral doping profiles and contact areas of the inventive multicolor LED arrays.

FIG. 2 shows as an example a 2-dimensional distribution of pixels 1–3, each representing one of three elementary colors blue, green, and red. In the following examples, fabrication steps for different LED arrays which reproduce such a pixel distribution are illustrated. It is obvious, that this example can be modified in many ways. The colors, the number of different colors, the size, the shape and the arrangements of the pixels are arbitrary. However, this is an extreme example illustrating relevant features of this invention. This particular arrangement of pixels is suited for full color displays for the presentation of color images, since the arrangement can be interpreted as regular pattern generated from three subpixels, a blue, a green, and a red one, by equal translations in two dimensions.

In the following, cross sections through LED arrays along one line of LEDs are shown, and the main fabrication steps of these particular arrays are described. Cross sections in other directions would be qualitatively equivalent as far as the portions of single LEDs are concerned. Differences can appear in the context of electrical isolation between different single devices, for example the isolation of LEDs in x-y line-addressable LED arrays. In the latter case, the x-y addressing can lead to isolation approaches which are different for the x- and y-directions. Such differences are discussed later when 2-dimensional arrays with a high pixel density are treated.

Figure 3A:
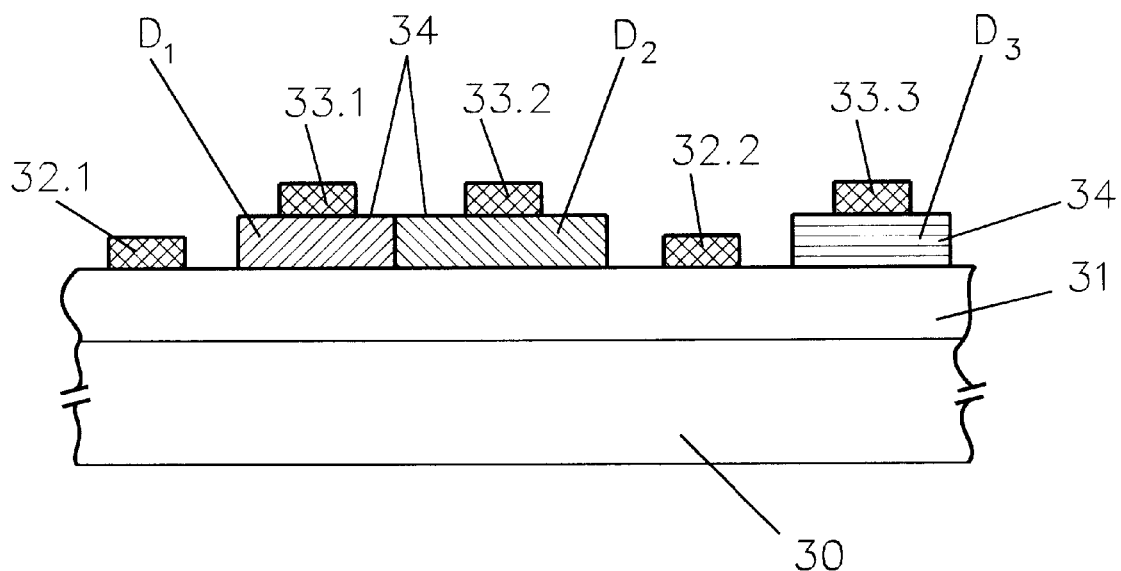
FIG. 3A shows an example of a vertical profile of a MIS-type LED on a nonconductive substrate.

A first embodiment of this invention is shown in FIG. 3A. It is a multicolor LED array based on MIS-LEDs which are made from the layered semiconductor structure in FIG. 1A. It is assumed that the substrate 30 (being equivalent to layer 10 in FIG. 1A) is not conductive, e.g. sapphire;

the LEDs represent light sources whose shape observed in the direction perpendicular to the substrate 30 corresponds to the pixel distribution in FIG. 2;

each LED can be biased via one individual metal contact 33.x (x=1, 2, . . . ) on top of the active layer 34 (being equivalent to layer 12 in FIG. 1A), this contact not being shared with other LEDS, and other contacts 32.x (x=1, 2, . . . ) which can be shared with other LEDs;

the electrical current through the active layer 34 of the LEDs is mainly perpendicular to the substrate 30 since the active layer is thin and its resistivity is high in comparison to the adjacent layers.

This specification requires the following steps in order to arrive at the device structure shown in FIG. 3A when starting with the layered semiconductor structure in FIG. 1A. Layer 12 is intended to become the active layer 34 of the LEDs shown in FIG. 3A. Therefore, it must be compensated with impurities as described above in accordance with the specified colors of the light sources to be fabricated. Since individual pixels with three different colors are desired, three different mask steps with subsequent doping steps are required, each step defining the doping conditions for the active areas of the entire set of equivalent LEDs. The hatched areas in FIG. 3 indicate regions which have been doped in one of the before-mentioned doping steps. These areas are marked with the symbols $D_i$ (i=1, 2, and 3) in order to distinguish between regions with different doping conditions. The shape of a particular island $D_i$ being characterized by constant doping conditions has not to be identical with the shape of light sources to be fabricated. As the thickness of the active layer is normally about 1 μm or less, the desired pixel size is normally larger than the thickness of the active layer 34 (but does not have to be). As the current injection into the active layer is considered to be mainly perpendicular to the substrate 30, and the shape of the light sources basically reflects the distribution of electrical current through the active layer 34, it is mainly the shape of the individual metal contact on top of the active layer which determines the shape of a particular light source. Therefore, in order to avoid leakage current in the LEDs, the constantly doped islands $D_i$ should not be smaller than the contacts 33.x. Limitations with respect to their shape are mainly given by the space requirements for different devices. Since the shape of the metal contact defines the light pattern emitted by the LEDs, transparent metals (e.g. ITO, i.e. indium tin oxide) can be used for the metal contacts if it is desired to collect the light out of the metal-contact side. Most metals absorb visible light. If such non-transparent metals are used for the metal contacts, the light of the LEDs can only be emitted through the substrate.

After the definition of islands with constant doping conditions, contacts for applying a bias to each particular LED are realized. The conductive semiconductor layer 31 of the LEDs serves as a common electrode to all LEDs unless device isolation is desired and appropriate means for electrical isolation such as etching of isolation trenches are applied. However, in this particular example, it is assumed that each LED is individually addressable by means of one individual contact on top of the compensated regions $D_i$. Consequently, the conductive layer 31 can be used as common electrode. As the substrate is assumed to be nonconductive, a physical contact to the conductive layer 31 must be realized. This can be done by etching a contact hole through the top layer 34 or using side contacts. However, if the LED array is large, the conductivity of the doped layer might not be sufficient for such contacts to the conductive layer 31. Then, a multitude of contact holes or trenches can be etched through the active layer and an appropriate wiring of conductive material 32.x can be installed to provide a low series resistance for all LEDs. For biasing a particular LED, contact areas are defined for each LED on top of the active layer 34 (or $D_i$), and metal contacts 33.x of appropriate shape corresponding to the desired shape of the pixels are realized, whereby known procedures for the metallurgy (see References cited above) and the pattern definition such as photolithographical steps or printing can be used. The application of these processing steps leads to the structure depicted in FIG. 3A.

For addressing each LED independently, different functional elements might be added. The contacts 32.x and 33.x could be connected to independent address lines on top of the structure shown in FIG. 3A, thus providing an external electrical connection to each individual LED. This can be helpful for connecting to the driver electronics required for biasing the LEDs. However, other methods known from microelectronic packaging can also be applied, e.g. the contact areas on the LEDs could be brought into electrical contact with the wiring on a second module through which the external bias to the contact areas can be applied.

Figure 3B:
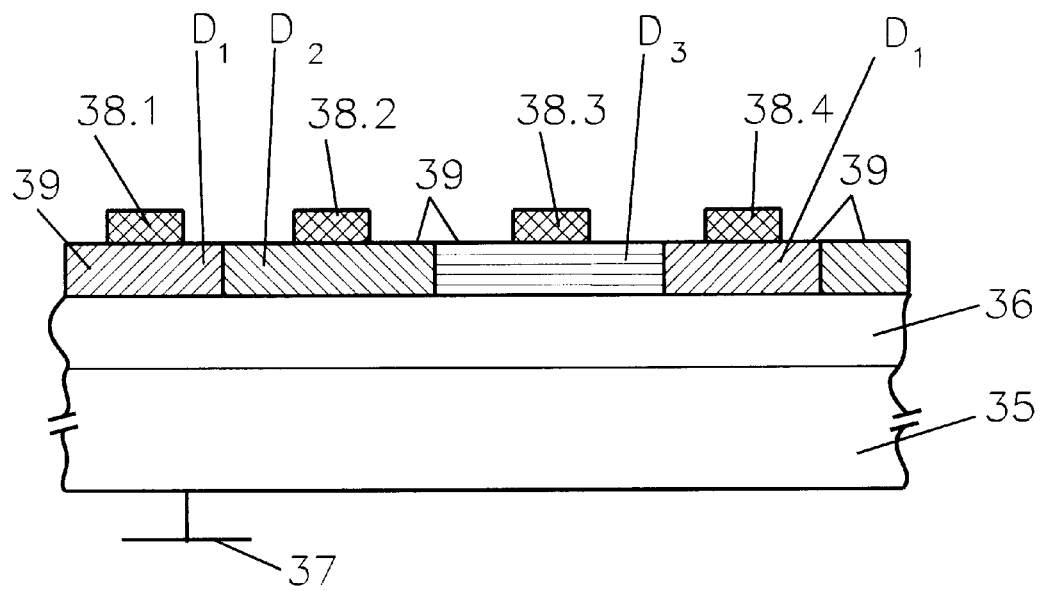
FIG. 3B shows an example of a vertical profile of a MIS-type LED on a conductive substrate.

The multicolor array shown in FIG. 3A can be simplified if the substrate is conductive (e.g. SiC, InGaAlN). In this case, the doped semiconductor layer 11 in combination with the substrate 10 serve as a single common electrode and special contact holes for accessing the doped semiconductor layer can be avoided. This simplification is shown in FIG. 3B. The simplified structure is equivalent to the structure in FIG. 3A. Layer 36 corresponds to layer 31. Only the top contacts 32.x to the conductive semiconductor layer are replaced by a contact to the substrate 35, which is in this particular example realized as bottom contact 37, thus leading to a simplification of the fabrication. Top contacts 38.x to the compensated regions $D_i$ define individual MIS-LEDs. Note the elimination of 32.x due to the conductive substrate 35 allows a greater portion of the surface area to be dedicated to color pixels, allowing increased pixel density and higher brightness.

Figure 4A:
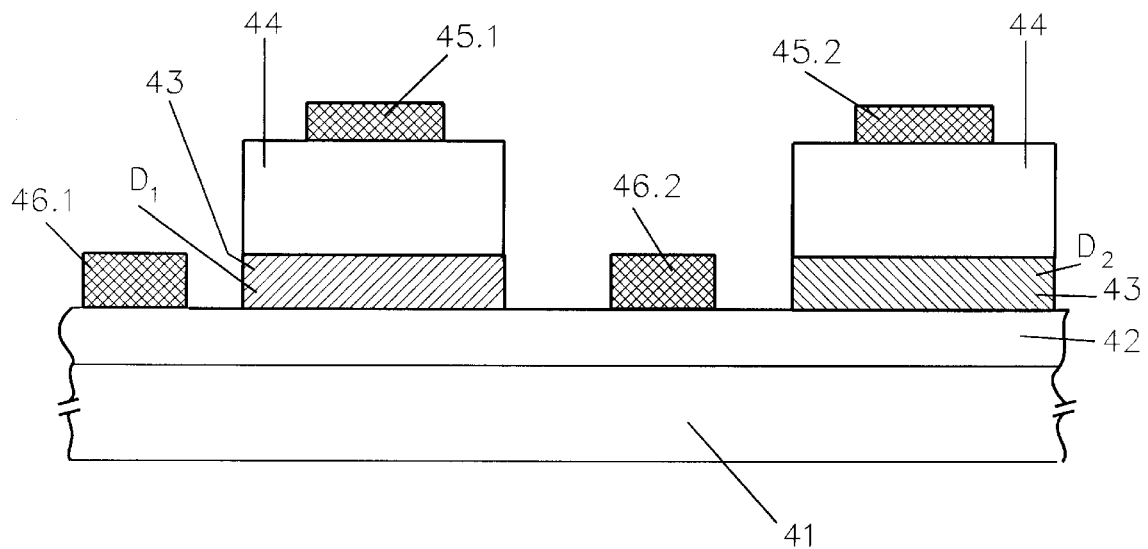
FIG. 4A illustrates an example of a vertical profile of a p-n-type LED on a nonconductive substrate.
Figure 4B:
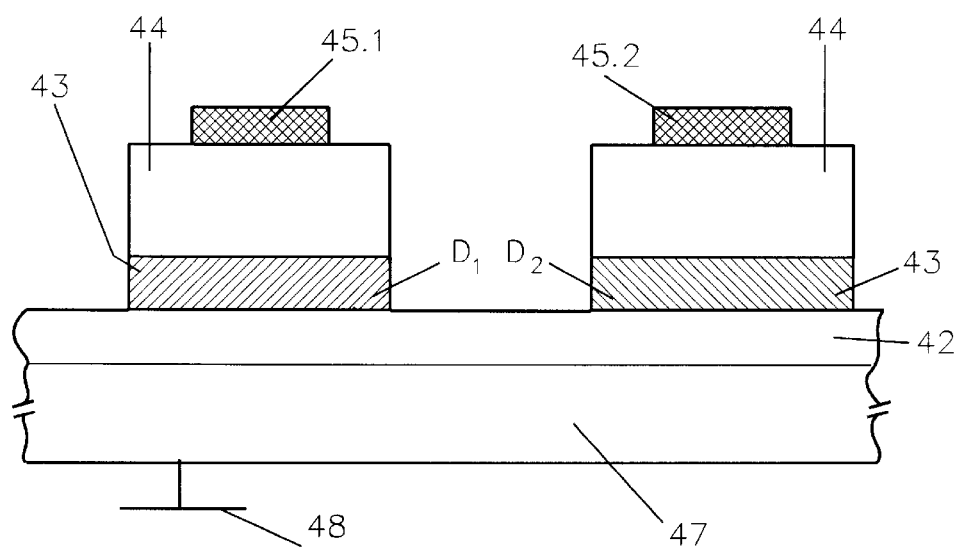
FIG. 4B illustrates an example of a vertical profile of a p-n-type LED on a conductive substrate.

FIG. 4A and 4B show a third and a fourth embodiment of this invention. They demonstrate the application of the inventive idea to LEDs with p-n-junctions. As an example, it is assumed that the same pattern of pixels having been discussed in the context of the previous embodiments is transferred to the layered semiconductor structure depicted in FIG. 1B. The major differences in comparison with the MIS-type devices are:

In order to provide the active layer with multicolor capabilities by doping after growth of the semiconductor layers, it is important to tailor the vertical profile of subsequently incorporated dopants correctly, since the thin active layer 17 or 43 is located in the p-n-junction and thus is not in direct contact to the surface of the layered semiconductor structure. Care must be taken that a sufficient number of dopants passes through the top layer 44 of the structure and reach the active layer 43. Therefore, the top layer—in the example of FIG. 1B a p-layer—is made as thin as possible, e. g. 100 nm–1 μm. Furthermore, it must be taken into account that the proposed doping procedure changes the doping of the layer 44 on top of the active layer 43 and, if the penetration depth of dopants is too high, the doping of layer 42 underneath as well. Therefore, in order to avoid a shift of the p-n-junction due to the proposed doping procedure, care must be taken that no part of any cladding layer 42 and 44 is completely compensated during the incorporation of dopants (generally acceptors) into the active layer 43. This is done by a careful control of the vertical doping profile and by setting the initial doping concentration of that layer, which is partly compensated due to the proposed doping procedure, sufficiently high. An appropriate doping procedure is ion implantation since the distribution of implanted ions is basically a peaked function whose characteristics, namely its width and the position of its center with respect to the surface bombarded with ions depend on the ion energy, on further parameters determined by the nature of the ions and the implanted material, and on the conditions of further optional processing steps such as annealing. Therefore, choosing appropriate parameters of the ion implantation process, a concentration of the dopants in the active layer 43 can be achieved, in accordance with the requirements of the fabrication of the devices shown in FIG. 4. An alternative approach leading to equivalent results is growth interruption of the layered semiconductor structure after growth of the active layer 43, subsequent definition of individual pixels by the application of the above-mentioned doping procedures, and the continuation of the growth of top cladding layer 44.

The top layer 44 of the structure shown in FIG. 4B is conductive. Therefore, the LEDs must be electrically isolated from each other. This can be done exploiting standard approaches, e.g. by etching isolation trenches through the uppermost cladding layer 44 and the active layer 43 or by making appropriate portions of the uppermost cladding layer 44 insulating, for example by compensation. The latter can be achieved by exploiting one or more mask steps with subsequent doping steps. Again, care must be taken for the control of the vertical doping profile in order to avoid leakage currents and electrical coupling of adjacent LEDs. These effects are present if the compensation of the top cladding layer 44 in regions between different LEDs is not complete.

For p-n-type LEDs, the shape of the top contact is less important for the shape of the light spot related to a particular LED since a current spreading occurs in the cladding layers due to their conductivity. The shape of the multicolor light sources can be defined in two ways, either by tailoring the lateral current profile within a particular LED (e.g. by electrical isolation, see above) and/or by shaping the lateral profile of those dopants which are responsible for the radiative transitions in the active layer.

Taking the remarks related to p-n-type LEDs into account, the above-mentioned steps are applied to the layered structure shown in FIG. 1B and two novel multicolor p-n-type LED arrays are realized. These examples are shown in FIG. 4A and 4B. Both examples are equivalent analogs of the MIS-type LEDs in FIG. 3. In particular, in the case of FIG. 4A, the substrate 41 is insulating. In the case of FIG. 4B, the substrate 47 is conductive. Again, like in the previous examples, areas with constant doping conditions are hatched and the symbols $D_i$ (i=1, 2, . . . ) are used to distinguish between different doping conditions and thus different colors of the related light sources. As electrical isolation between adjacent LEDs, the option of etching away parts of the uppermost cladding layer and the active layer has been chosen. As to approaches to form contacts for biasing individual LEDs, the same arguments hold as those given above in the context of MIS-devices. In particular, if each LED can be biased via an individual contact on top the uppermost cladding layer, the lower cladding layer 42 can be used as common electrode for all LEDs. Furthermore, if the substrate is conductive, it is sufficient even for a large substrate to use one common contact 48 to the substrate and one individual top contact 45.x for each LED for biasing, whereas in the case of an insulating substrate, a variety of contacts 46.x to the lower cladding layer might be required for large substrates in order to minimize the series resistance for all LEDs.

In the following, special considerations are made which are related to 2-dimensional arrays with a high density of (MIS- or p-n-type) LEDs. LEDs with radiative areas (in a plane parallel to the substrate) as small as 0.1 μm×0.1 μm are feasible based on modern semiconductor processing techniques, thus potentially allowing for a realization of multicolor displays with a resolution in excess of 100,000,000 pixels per cm$^2$. In this context, the question of how to address an individual pixel must be focussed on. If the pixel density is as high as 100,000,000 pixels per cm$^2$, it is not possible to connect each LED with one individual address line for biasing or even to two individual address lines if no contact common to all LEDs is available.

The classical solution for such addressing problems is the above-mentioned x-y line addressing, i.e. assuming that each device to be addressed is a two-terminal device which is activated by applying an appropriate bias between two terminals and all devices are arranged in a 2-dimensional regular array such that a particular device can be identified by a particular row (the x-row) and a particular column (the y-column) of the array. The addressing of a dense 2-dimensional array of equivalent devices is achieved by providing 2 orthogonal sets of independent address lines, namely x-row-lines and y-column-lines, each row-line being attributed to a particular row of the array and each column-line being attributed to a particular column of the array. In x-y line addressing, one terminal of each particular device, said terminal being functionally equivalent for all devices, is connected to the row-line attributed to the device, and the other terminal of each particular device is connected to the column line attributed to the device, and a particular device is activated by applying a bias to the appropriate row- and column line, simultaneously.

So far, embodiments of this invention have been discussed which are characterized by terminals shared between a multitude of devices, either by contacting a conductive semiconductor layer or substrate common to all or multiple devices or by using a conductive substrate which is connected to all devices. Such designs allow for the fabrication of LED arrays with a high spatial LED density since space is saved by sharing terminals. However, these designs require the biasing of each LED via an individual address line. Therefore, 2-dimensional arrays based on such designs are not suited for x-y line-addressing, unless a control device is added to each LED, said device controlling the bias to one independent terminal of a particular LED and being controlled via x-y line-addressing.

In the following, one example of a control device which allows for applying x-y line-addressing to the novel structures having been discussed so far is given. An appropriate control device can be a 3-terminal device such as a transistor, two terminals being connected to a x-row-line and a y-column-line, both terminals in combination controlling the electrical current flowing through the third terminal. This third terminal of this controllable current source can be used for biasing one LED whose second terminal is on a predefined electrical potential. Thus, an x-y addressable 2-dimensional LED array can be realized as a combination of a 2-dimensional array of LEDs having one terminal in common, an array of x-y address lines, and an array of transistors, each transistor being situated at a node of the x-y address lines and being connected to the address lines and the LEDs as described above. This approach is suited for monolithic integration, since technologies which have been developed for LCD displays, in particular the thin-film transistor technology, (see introductory portion) can be adopted. For thin-film transistors, semiconductor materials such as amorphous silicon (a-Si), polycrystalline silicon (poly-Si), CdSe, CdS, amorphous Ge, etc. have been exploited. a-Si and poly-Si are most widely used. An advantage of thin-film transistor technology is the possibility of providing uniform, reproducible film quality over large areas by using fabrication methods such as chemical vapor deposition (CVD) or plasma-enhanced vapor deposition (PECVD), thus the possibility of scaling transistor circuitry to large sizes, and the compatibility with many classes of materials, which can serve as substrates, e.g. crystalline semiconductors, metals, dielectrics, glasses, polymers etc.. In accordance with these characteristics, the known thin-film transistor technology can be combined with the novel LED arrays under consideration.

Figure 5:
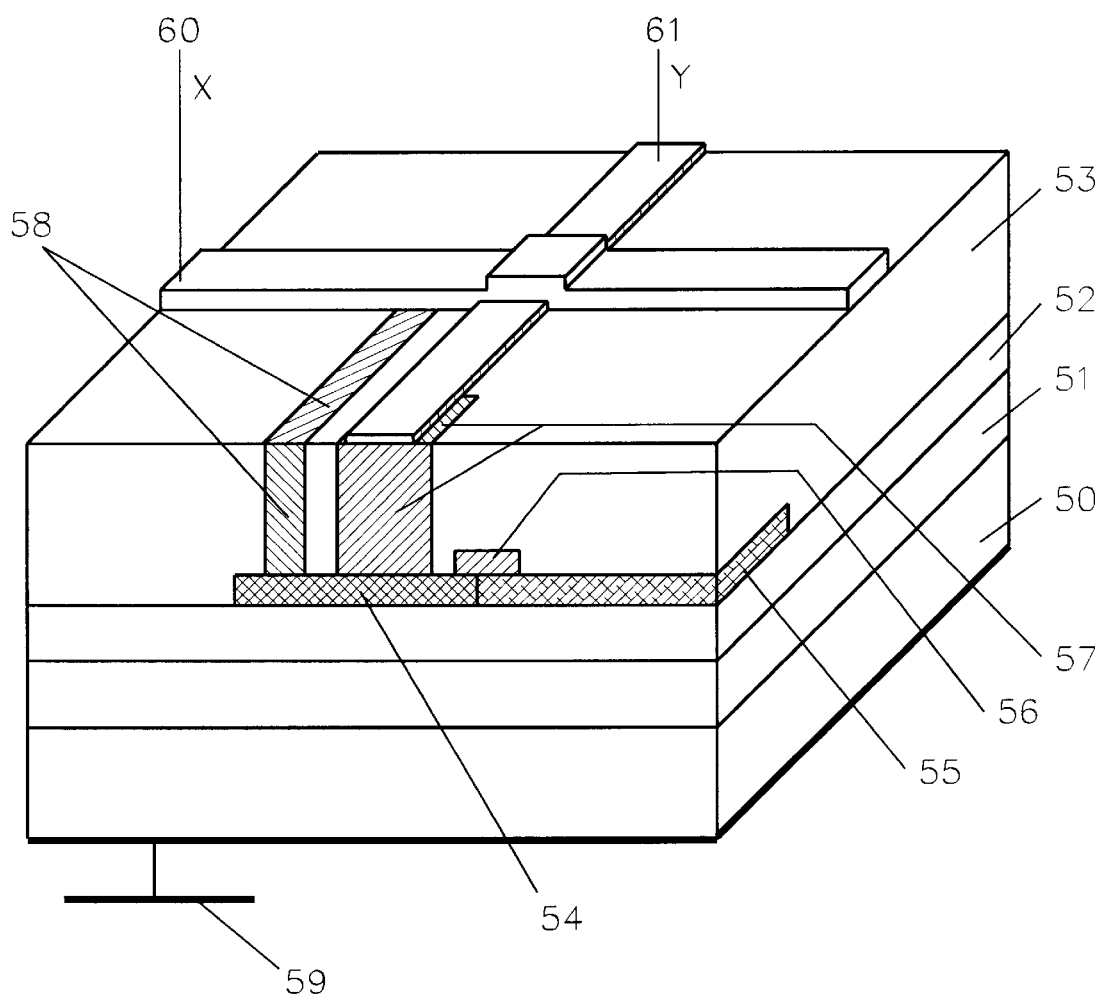
FIG. 5 depicts a portion of a high-density 2-dimensional x-y addressable LED array on a conductive substrate serving as common electrode. The electron emitting and electron collecting layers are vertically arranged.

One example of such a combination is shown in FIG. 5. FIG. 5 shows a portion of a x-y addressable LED array which is basically the array shown in FIG. 3B, each LED being connected to one transistor 54 of a transistor array on top of the LED array, and each transistor being connected to a x-row-line 60 and a y-column line 61 of a network of x-y address lines via two terminals 57 and 58. In FIG. 5, a particular LED is shown, the LED consisting of a metal contact 55 on top of a stack of three layers 50, 51, and 52, corresponding to the layers 35, 36 and one of the compensated zones $D_i$ in FIG. 3, respectively. The LED is connected via interconnect element 56 to the third terminal of transistor 54, this terminal providing an appropriate bias to the LED, under control of the bias to the other two terminals 57 and 58 of the transistor. For the isolation of all independent electrically active parts of the array, the terminals 56–58 of the transistors and the top contacts 55 of the LEDs are imbedded in an insulating layer 53, e. g. in a polyimide layer. Furthermore, the x-y address lines 60,61 are isolated against each other. Equivalently, the other embodiments of this invention can be prepared for x-y addressing.

In the above-mentioned example, the thin-film transistors have been introduced as a nonlinear circuit which transforms two input signals, namely signals on an x- and a y-address line, into one signal which is used for biasing a LED which has only one independent terminal and one terminal in common with other LEDs. Thus, the function of the transistor matrix in this case is different from the role of the thin-film transistor circuitry in the case of active-matrix LCD displays, where the transistor is not necessary for activating a particular pixel—this would work without transistors—but helps improving certain limitations which are due to intrinsic physical properties of liquid crystals and their response to electrical fields and lead to image deteriorations such as reduced contrast, reduced viewing angle, cross talk between adjacent pixels etc. (see introductory portion of this description). However, such deteriorations do not appear in 2-dimensional LED arrays consisting of LEDs whose two terminals are directly connected to x-y address lines. The lack of such deteriorations in LED displays is due to several features of LEDs, namely their fast response speed and the fact that the intensity of a particular LED is a strongly nonlinear function of the bias to the LED. Therefore, LED arrays are desired which can operate without a transistor matrix as the connecting element between LEDs and x-y address lines.

In the following, examples of multicolor 2-dimensional x-y addressable LED arrays which are in accordance with this invention and operate without a transistor matrix as the connecting element between LEDs and x-y address lines are given. In all these examples, 2 independent terminals of each LED are accessible from the top side of an appropriate layered semiconductor structure and are connected to an array of x-y address lines on top of the structure. In these examples, both independent terminals are situated on a planar surface and a major part of the current which is injected into the active region of the LEDs flows in the lateral direction parallel to the substrate.

Figure 6:
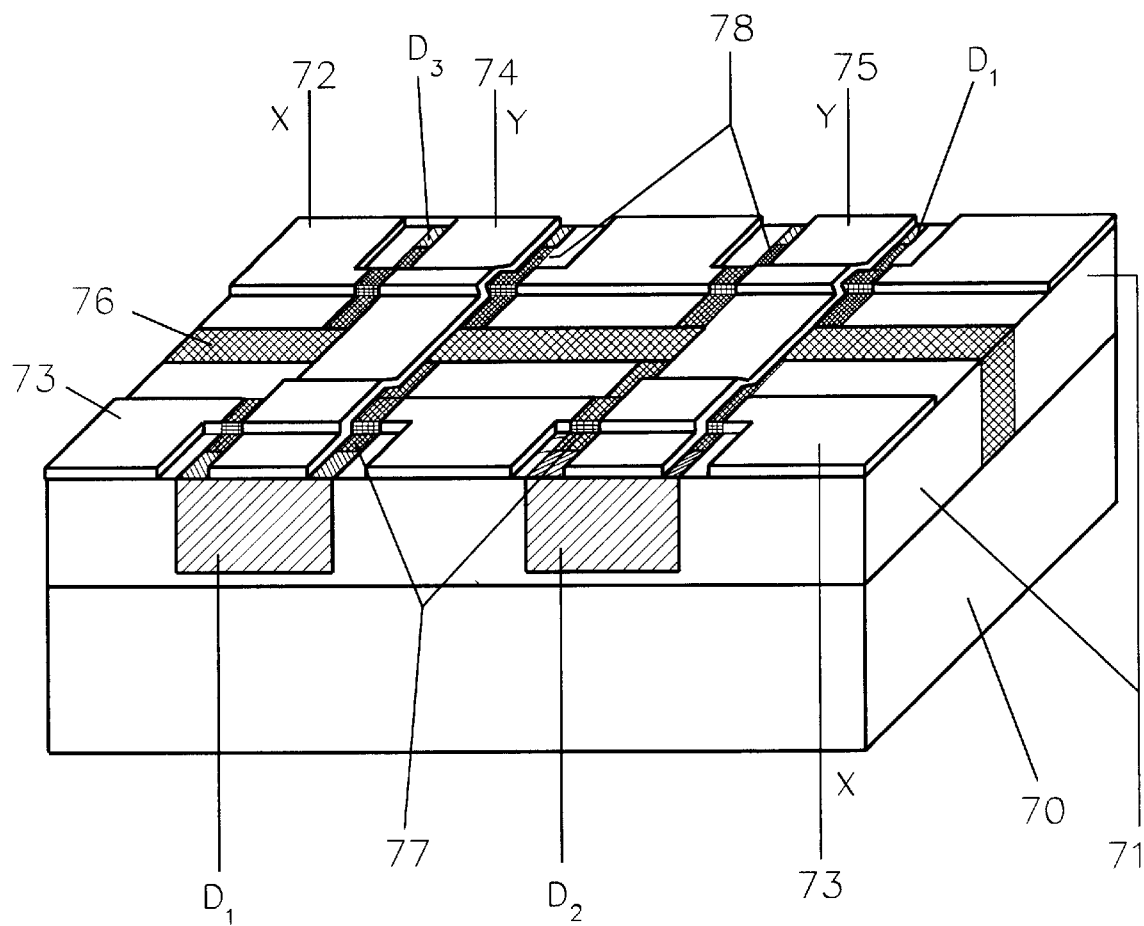
FIG. 6 depicts a portion of an array of multicolor MIS-LEDs with a lateral arrangement of the electron emitter and the electron collector, the array being suitable for x-y addressing

FIG. 6 shows example of a multicolor 2-dimensional x-y addressable LED array which is based on MIS-type LEDs. The fabrication of this particular structure starts from a single n-type layer 71, which is either undoped (i.e. unintendedly undoped) or n-doped. In this layer, MIS-type LEDs are realized in a lateral arrangement. This is done by generating insulating regions by means of the above-mentioned doping techniques, whereby the doping conditions are chosen such that the insulating regions, which serve as active regions of the LEDs, are capable of generating radiation with predefined colors. Regions with different doping conditions are denoted in FIG. 6 with different symbols $D_i$ (i=1, 2, . . . ). Contacts 72, 73, 74, and 75 for applying a bias between an insulating region and its n-doped environment complete a particular LED, whereby—in contrast to the previous embodiments—the electrons are injected primarily laterally into the active region where they radiatively recombine with impurity-related holes. For a suppression of leakage currents between different LEDs and thus cross-talk between different LEDs, electrical isolation 76 between adjacent LEDs can be introduced. Known isolation approaches are sufficient for the inventive LED arrays, e.g. etching of deep isolation trenches or doping for introducing current blocking regions such as p-n-junctions or compensated (i.e. insulating) regions. The latter approach is obviously an application of the above-mentioned doping techniques. As a major part of the electrical current flows close to the upper surface of the semiconductor layer 71, the depth of said isolating regions is an important optimization parameter for minimizing leakage currents. Perfect isolation can be achieved by using insulating substrates 70 and perfectly suppressing the lateral current between different LEDs by making the depth of said isolating regions equal to the thickness of the semiconductor layer 71. Means for isolation 77, 78, e.g. thin dielectric layers, assure that the address lines 72–75 are connected only to appropriate terminals of the LEDs and that individual LEDs can be addressed and activated for the generation of light.

The structure shown in FIG. 6 can be modified in different ways within the same concept of lateral injection of carriers into the insulating region of MIS-LEDs. The basic idea behind these lateral realizations is that they can be made in a single semiconductor layer grown on a substrate. This semiconductor layer being the starting point for the fabrication of an array of MIS-LEDs is intended to be either the (n- or p-) doped region or the insulating region of the MIS-LEDs, whereby the respective counterparts of the MIS-LEDs are realized by applying the above-mentioned doping techniques to certain regions on the surface of said semiconductor layer and by providing metal contacts. In addition, as in the previous example, means for isolation of adjacent LEDs are optional.

Figure 7:
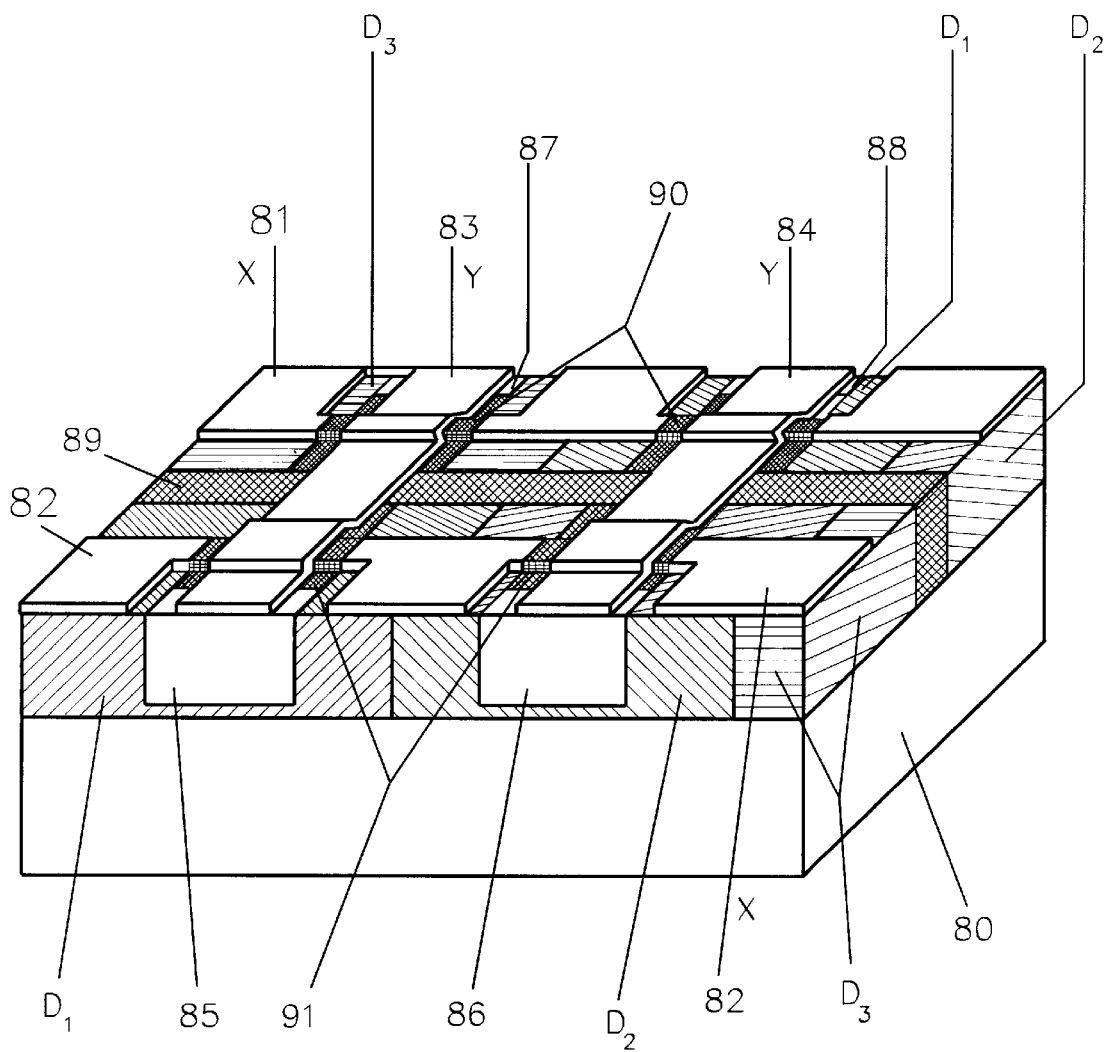
FIG. 7 depicts a portion of a further embodiment of a multicolor MIS-LED array with a lateral arrangement of the electron emitter and the electron collector, the array being suitable for x-y addressing.

A further realization of this general concept is given in FIG. 7. In this case, a semiconductor layer grown on the substrate 80 is made insulating by compensation, whereby the above-mentioned doping techniques are used to introduce a pattern of regions $D_i$ (i=1, 2, . . . ) with different compensating doping conditions in accordance with a pre-defined pattern of colors to be generated by the final LED array. In each of these portions characterized by constant doping conditions, one or more conductive islands 85–88 are realized by applying the above-mentioned doping techniques. For reducing leakage currents, it is favorable to assure that the depth of the conductive islands is less than the depth of the insulating portions. Metal contacts 81, 82 to the insulating portions and contacts to the conductive islands 83, 84 finally complete the MIS-LED array. Again, means for isolation 89 of adjacent LEDs are optional. Means for isolation 90, 91, e.g. thin dielectric layers, assure that the address lines 81–84 are connected only to appropriate terminals of the LEDs and that individual LEDs can be addressed and activated for the generation of light.

So far, it has been assumed that the LEDs are realized in crystalline semiconductor layers. This choice offers the highest power efficiency possible. However, due to the limited size of today's substrates appropriate for the growth of high-quality epitaxial layers, the maximum size of LED arrays based on crystalline layers is also limited to less than the size of state-of-the-art LCD displays, which are fabricated on glass. Therefore, displays based on crystalline semiconductor LEDs are best suited for projection applications. In order to overcome the size limitation for the novel devices under consideration, all epitaxial layers can be replaced by appropriate thin amorphous or poly-crystalline films of the same material. The availability of techniques for uniformly depositing such thin films on large (conductive or insulating) substrates such as glass or any substrate which is used for the thin-film transistor arrays for large active-matrix LCD displays assures that the novel devices under consideration can be scaled—like a LCD display—to any size when being realized with thin amorphous or poly-crystalline semiconductor films.

Figure 8:
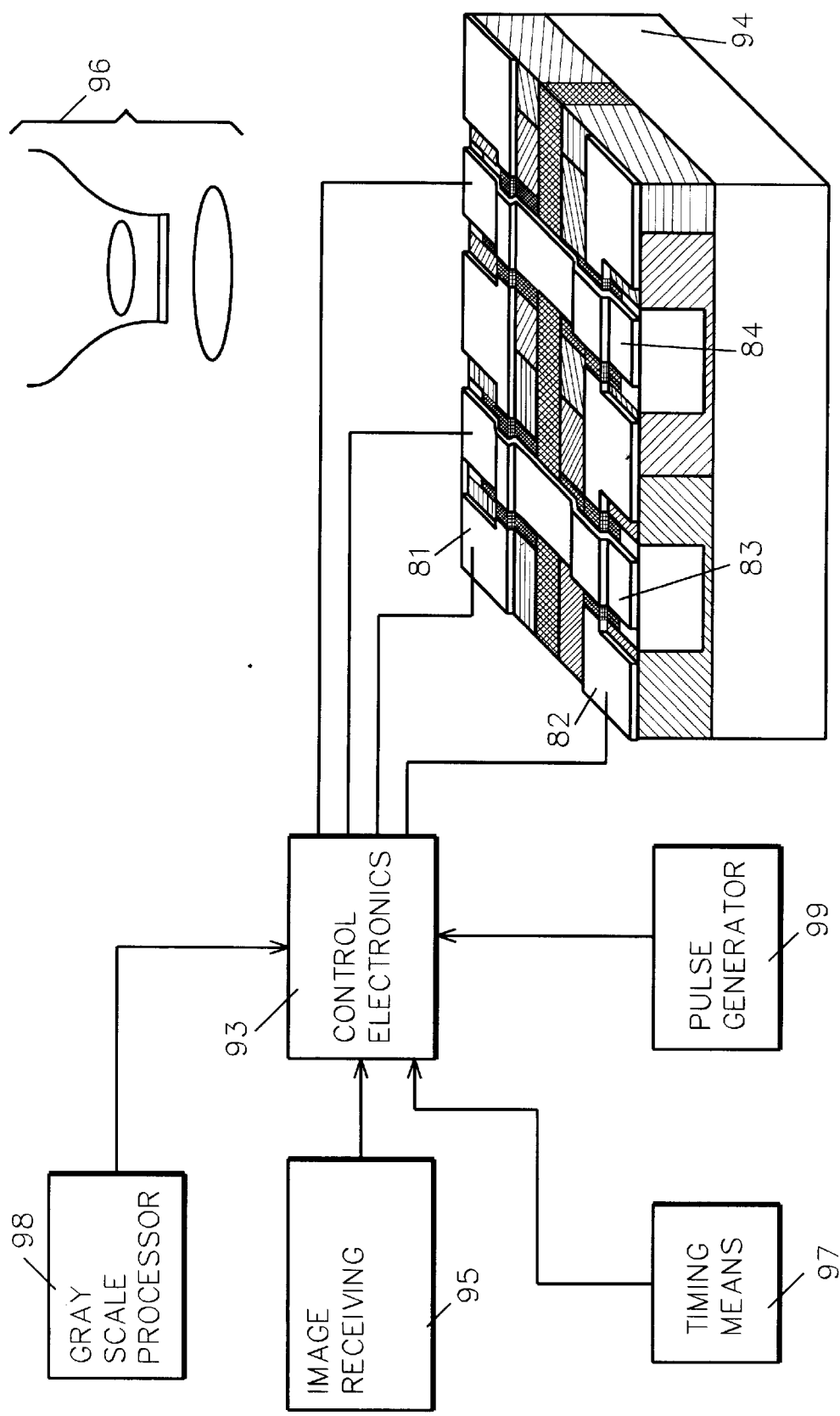
FIG. 8 depicts an embodiment of the inventive MIS-type LED in a multicolor display.

On the basis of the multicolor LED arrays in accordance with this invention, novel emissive multicolor displays can be made by adding further features which depend on the particular display application and can be engineered on the basis of common technologies. So far, a variety of novel monolithic LED arrays with multicolor capability including means for addressing individual LEDs and applying an appropriate bias to them have been disclosed, whereby the term 'means for addressing' stands for the availability of one or more contacts on the monolithic array, said contacts allowing for biasing any predefined LED by means of a power supply. Any of these novel LED arrays can be taken as a display's visualizing component making predefined data visible to a viewer, whereby each LED represents a picture element of the display and the geometry and the color capability of each LED is designed accordingly. In order to make a complete display from the disclosed LED arrays of the type depicted in FIG. 8, further optional functional elements to be added can be taken from the following list:

a mechanical mount 94 for supporting the LED array such that individual light sources attributed to individual LEDs can be viewed;

control electronics 93 for controlling the bias of said LEDs and thus their light intensity, said control electronics further comprising an interface 95 for receiving image data to be displayed;

an optical imaging system 96 for projection of the light sources of the display;

a timing system 97 for handling time-dependent image data, e.g. video signals;

a gray-scale processor 98 for handling gray levels of individual subpixels;

a pulse generator 99 for biasing the LEDs in a pulsed mode; such a pulsed mode is useful for x-y addressing, where individual pixels are subsequently addressed, for gray-scale processing by adopting pulse lengths, pulse heights, and/or repetition rates of applied pulses, and for the optimization of the power efficiency of the LEDs by reducing the heat generation and thus increasing the internal efficiency of the LEDs.

LED arrays offer the possibility of realizing displays with a high pixel density (see above), whereby pixel sizes 1 $\mu$m by 1 $\mu$m or even less are feasible. This feature can be taken as an advantage in projection displays. In projection displays, conventional optics used to generate real or virtual images of a primary display. The high pixel density and the high brightness of LEDs allow for the application of imaging optics with a large magnification factor in excess of 100. Thus cm size LED arrays can be used to generate m size images which can be projected on a flat screen and can be viewed with a sufficient resolution of 10 pixel/mm. The novel devices disclosed in this description make full color versions of LED based projection displays possible. Such displays are compatible with today's crystalline substrates.

In summary, a concept for making monolithic arrays of light emitting diodes at multiple wavelengths and their use in multicolor displays is presented. Such multicolor displays are valuable in combination with many data generating systems, e.g. computers.

I claim:

1. A monolithic array of light emitting diodes (LEDs) for the generation of light at multiple wavelengths, comprising:
    a substrate;
    a layered structure of semiconductor films formed on the substrate including a top layer most distant from the substrate;
    a plurality of LEDs formed in the layered structure, at least one LED being a metal-insulator-semiconductor (MIS) diode including an insulating portion and a conducting portion both formed in the top layer, wherein at least one of the insulating portion and the conducting portion is formed by a lateral variation of doping conditions of the top layer.

2. The array of claim 1, wherein at least one of the LEDs has an active region, and an electroluminescence spectrum determined by impurity states in the material forming the active region, said impurity states leading to optical transitions with energies below the bandgap energy of the active region.

3. The array of claim 2, wherein the electroluminescence spectrum of at least one of the LEDs comprises at least two different emission wavelengths, whereby a change in a bias applied to the LED causes a change in relative intensity of the electroluminescence at the emission wavelengths of the LED.

4. The array of claim 2, wherein the electroluminescence spectrum of at least one of the LEDs comprises only one emission line at one wavelength.

5. The array of claim 1, wherein the doping conditions are dependent on at least one of dopant type, local concentration, and doping process.

6. The array of claim 1, wherein light from the LEDs is partially radiated into at least one of a halfspace above the substrate, and a halfspace below the substrate.

7. The array of claim 1, wherein the substrate is transparent for generated light and part of the generated light is radiated through the substrate.

8. The array of claim 1, wherein more than one of the LEDs is based on a metal-insulator-semiconductor structure.

9. The array of claim 1, wherein at least one LED has its insulating portion embedded in its conducting portion.

10. The array of claim 1, wherein at least one LED has its conducting portion embedded in its insulating portion.

11. The array of claim 1, wherein at least one LED is a p-n junction based device having an active region, and dopants responsible for an emission wavelength associated with the LED are contained in the active region.

12. The array of claim 1, wherein the layered structure of semiconductor films is based on the material system $(Ga_{1-x}Al_x)_{1-y}In_yN$.

13. The array of claim 1, wherein contact areas for applying a bias to a particular LED are on the same side of the substrate.

14. The array of claim 1, wherein the substrate is conductive and serves as a common electrode of at least two LEDs.

15. The array of claim 1, wherein n different wavelengths, n greater than or equal to 2, are generated, and n times m LEDs are geometrically arranged in m equivalent pixels, m greater than or equal to 1, each pixel containing n adjacent subpixels, and each of the n subpixels being identified with one LED for the generation of one of the n different wavelengths.

16. The array of claim 15, wherein the material composition of the semiconductor films is chosen such that the fundamental absorption edge is in one of the blue spectral range or the ultraviolet spectral range, and the doping conditions in the active regions for the LEDs are chosen such that at least one subpixel serves for the generation of light in the spectral range between ultraviolet and bluegreen, at least one subpixel serves for the generation of light in the spectral range between bluegreen and yellow, and at least one subpixel serves for the generation of light in the spectral range between yellow and infrared.

17. The array of claim 16, wherein each pixel contains 3 subpixels and the pixels are arranged in a two-dimensional array.

18. A multicolor display comprising:
a layered structure of semiconductor films formed on the substrate including a top layer most distant from the substrate;
an LED array comprising a plurality of LEDs formed in the layered structure, at least one LED being a metal-insulator-semiconductor (MIS) diode including an insulating portion and a conducting portion both formed in the top layer, wherein at least one of the insulating portion and the conducting portion is formed by lateral variation of doping conditions of the top layer;
means for addressing and applying a bias to individual LEDs in said LED array; and
a mechanical mount for supporting said LED array such that individual light sources attributed to the LEDs can be viewed.

19. The multicolor display of claim 18, further comprising:
means for controlling the bias applied to the individual LEDs; and
an interface for receiving image data to be displayed.

20. The multicolor display of claim 19, wherein the means for controlling the bias applied to the individual LEDs also comprises a means for controlling the light intensity of the LEDs.

21. The multicolor display of claim 19, further comprising a timing system for handling time-dependent image data.

22. The multicolor display of claim 19, further comprising a gray scale processor for handling gray levels of individual subpixels.

23. The multicolor display of claim 19, further comprising a pulse generator for biasing the LEDs in a pulsed mode.

24. A multicolor projection display comprising:
a layered structure of semiconductor films formed on a substrate including a top layer most distant from the substrate;
an LED array comprising a plurality of LEDs formed in the layered structure, at least one LED being a metal-insulator-semiconductor (MIS) diode including an insulating portion and a conducting portion both formed in the top layer, wherein at least one of the insulating portion and the conducting portion is formed by lateral variation of doping conditions of the top layer;
means for addressing and applying a bias to individual LEDs in said LED array;
a mechanical mount for supporting said LED array such that individual light sources attributed to the LEDs can be viewed; and
an optical imaging system for a projection of the light sources of the multicolor display.

25. The multicolor projection display of claim 24, further comprising means for projection on a screen.

26. A computer including a multicolor display, the multicolor display comprising:
a layered structure of semiconductor films formed on a substrate including a top layer most distant from the substrate;
an LED array comprising a plurality of LEDs formed in the layered structure, at least one LED being a metal-insulator-semiconductor (MIS) diode including an insulating portion and a conducting portion both formed in the top layer, wherein at least one of the insulating portion and the conducting portion is formed by lateral variation of doping conditions of the top layer;
means for addressing and applying a bias to individual LEDs in said LED array; and
a mechanical mount for supporting said LED array such that individual light sources attributed to the LEDs can be viewed.

* * * * *